(12) United States Patent
Muthiah et al.

(10) Patent No.: US 11,295,051 B2
(45) Date of Patent: Apr. 5, 2022

(54) SYSTEM AND METHOD FOR INTERACTIVELY CONTROLLING THE COURSE OF A FUNCTIONAL SIMULATION

(71) Applicant: HCL Technologies Limited, Noida (IN)

(72) Inventors: Manickam Muthiah, Chennai (IN); Jabeer Ahamed Mohammed Nowshath, Chennai (IN); Sathish Kumar Krishnamoorthy, Chennai (IN)

(73) Assignee: HCL Technologies Limited, Noida (IN)

(*) Notice: Subject to any disclaimer, the term of this patent is extended or adjusted under 35 U.S.C. 154(b) by 0 days.

(21) Appl. No.: 16/118,442

(22) Filed: Aug. 31, 2018

(65) Prior Publication Data

US 2019/0286771 A1 Sep. 19, 2019

(30) Foreign Application Priority Data

Mar. 13, 2018 (IN) .............................. 201811009241

(51) Int. Cl.
*G06F 30/33* (2020.01)
*G06F 30/30* (2020.01)
*G06F 30/333* (2020.01)

(52) U.S. Cl.
CPC .............. *G06F 30/33* (2020.01); *G06F 30/30* (2020.01); *G06F 30/333* (2020.01)

(58) Field of Classification Search
CPC ............. G06F 17/5022; G06F 17/5045; G06F 2217/14; G06F 30/30; G06F 30/33; G06F 30/333
See application file for complete search history.

(56) References Cited

U.S. PATENT DOCUMENTS

| 6,243,833 | B1 | 6/2001 | Hitchcock et al. |
| 6,557,147 | B1 * | 4/2003 | Lee ................. G01R 31/31905 716/106 |
| 6,704,895 | B1 * | 3/2004 | Swoboda ....... G01R 31/318536 714/30 |

(Continued)

OTHER PUBLICATIONS

Altera, "Analyzing and Debugging Designs with System Console". Jun. 2014. (Year: 2014).*

*Primary Examiner* — Jack Chiang
*Assistant Examiner* — Aric Lin
(74) *Attorney, Agent, or Firm* — Kendal Sheets

(57) ABSTRACT

The present disclosure relates to system(s) and method(s) for interactively controlling the course of a functional simulation of DUV/SUV. The system comprises a testbench and the DUV/SUV connected to the testbench. The testbench generates a set of input data/packets as a stimulus to be processed by the DUV/SUV. The set of input data/packets is generated to simulate and verify the DUV/SUV. Further, the testbench identifies a pre-defined event at runtime during the simulation. Upon identification of the event, the testbench is configured to pause the simulation and transmit a notification message to a user indicating the occurrence of the event. Further, the testbench waits for a pre-defined time interval to receive one or more user inputs. The testbench further generates new stimulus based on the one or more user inputs and resumes the paused simulation with the new stimulus, thereby controlling the course of the functional simulation.

8 Claims, 3 Drawing Sheets

(56) References Cited

U.S. PATENT DOCUMENTS

| | | |
|---|---|---|
| 6,892,328 B2 | 5/2005 | Klein et al. |
| 7,778,812 B2 | 8/2010 | Hoffman, Jr. |
| 8,726,086 B2 | 5/2014 | Warren et al. |
| 2001/0023338 A1 | 9/2001 | Guarracino et al. |
| 2002/0049578 A1* | 4/2002 | Ohkami ............... G06F 30/33 703/15 |
| 2005/0012510 A1* | 1/2005 | Thibedeau ........... G01R 31/389 324/691 |
| 2005/0149898 A1* | 7/2005 | Hakewill ............. G06F 30/30 716/102 |
| 2005/0257185 A1* | 11/2005 | Querbach ............ G06F 30/367 716/108 |
| 2008/0010536 A1* | 1/2008 | Bates .................. G06F 11/3644 714/38.13 |
| 2014/0143600 A1* | 5/2014 | Hutner ............ G01R 31/31705 714/35 |
| 2015/0067622 A1* | 3/2015 | Goswami ........... G06F 17/5009 716/106 |
| 2015/0121346 A1* | 4/2015 | Patel .................. G06F 11/3664 717/125 |
| 2016/0306913 A1* | 10/2016 | Lu ...................... G06F 17/5022 |

\* cited by examiner

SYSTEM AND METHOD FOR INTERACTIVELY CONTROLLING THE COURSE OF A FUNCTIONAL SIMULATION

CROSS-REFERENCE TO RELATED APPLICATIONS AND PRIORITY

The present application claims benefit from Indian Complete Patent Application No 201811009241 filed on 13 Mar. 2018 the entirety of which is hereby incorporated by reference.

TECHNICAL FIELD

The present disclosure in general relates to the field of hardware logic/electronic design/digital circuits verification. More particularly, the present invention relates to control the course of a functional simulation of Design Under Verification or System Under Verification (DUV/SUV) based on user inputs.

BACKGROUND

Integrated Circuit Design (ICD) or Chip Design is a branch of electronics engineering. ICD deals with encompassing the particular logic and circuit design techniques required for designing integrated circuits, or ICs. Initially, the integrated circuits contained only a few transistors. However, the number of transistors in the integrated circuits has increased dramatically since then. The term "large scale integration" (LSI) was first used to describe this theoretical concept, which further gave rise to the terms "small-scale integration" (SSI), "medium-scale integration" (MSI), "very-large-scale integration" (VLSI), and "ultra-large-scale integration" (ULSI). The development of VLSI started with hundreds of thousands of transistors in the early 1980s, and has continued beyond ten billion transistors as of now.

Modern ICs are immensely complicated. The complexity of modern IC design and market pressure for producing designs rapidly has led to the extensive use of automated design tools in process of IC designing. In short, the design of an IC using Electronic Design Automation (EDA) is the process of design, verification and testing of the instructions that the IC has to carry out.

Electronic Design Automation (EDA) and Electronic Computer-Aided Design (ECAD) is a category of tools that is used to design electronic systems such as integrated circuits as well as printed circuit boards. Designers use these tools that work together in a flow to design and analyze the entire semiconductor chips. EDA tools are essential for designing modern semiconductor chips which have billions of components. The EDA tools help chip design with programming languages that compiled them to silicon. Due to immediate result, there was a considerable increase in the complexity of the chips that could be designed, with improved access to design verification tools that are based on Logic Simulation. A chip designed using this process is easier to layout and more likely to function correctly, since the design of the chip could be simulated more thoroughly prior to construction. Although the languages and tools have evolved, this general approach of specifying the desired behaviour in a textual programming language and letting the tools derive the detailed physical design has remained the basis of digital IC design even today.

A Simulation (or "sim") is an attempt to model a real-life or hypothetical situation on a computer to study the working of the system. Predictions may be made about the behaviour of the system, by changing variables in the simulation. It is a tool to virtually investigate the behaviour of the system under study.

A Logic simulation is the use of simulation software for predicting the behaviour of digital circuits and Hardware Description Languages (HDL). It simulates the logic before it is built. Simulations have the advantage of providing a familiar look and feel to the user in that it is constructed from the same language and symbols used in design. Simulation is a natural way for the designer to get feedback on their design, by allowing the user to interact directly with the design. Logic simulation may be used as part of the Functional Verification process in designing hardware.

Functional verification is the process followed for verifying whether the logic design conforms to the design specification. In everyday terms, functional verification asserts whether the proposed design do what is intended. This is a complex task, and takes the majority of time and effort in largest electronic system design projects.

Hardware Description language (HDL) is a specialized computer language used for describing the structure and behaviour of electronic circuits, and most commonly, digital logic circuits. A hardware description language enables a precise, formal description of an electronic circuit which allows for the automated analysis and simulation of an electronic circuit. A hardware description language is much like a programming language such as C Programming language. HDL is a textual description language consisting of expressions, statements and control structures. One important difference between most programming languages and HDLs is that HDLs explicitly include the notion of time. The key advantage of a HDL, when used for systems design, is that it allows the behaviour of the required system to be described (modelled) and verified (simulated) before synthesis tools translate the design into real hardware (gates and wires). With time, VHDL and Verilog emerged as the dominant HDLs in the electronics industry, while older and less capable HDLs gradually disappeared. Over the years, much effort has been invested in improving HDLs. The latest iteration of Verilog, formally known as System Verilog, introduces many new features (classes, random variables, and properties/assertions) to address the growing need for better testbench randomization, design hierarchy, and reuse.

A testbench is an (often virtual) environment used to verify the correctness or soundness of a design or model. In the context of firmware or hardware engineering, a testbench refers to an environment in which the design/system/product under development is verified with the aid of software and hardware tools. The suite of verification tools is designed specifically for the design/system/product under verification. Testbench, commonly referred as verification environment (or just environment) contains a set of components such as bus functional models (BFMs), bus monitors, memory modules, and interconnect of such components with the Design Under Verification (DUV).

A simulation environment is typically composed of several types of components. The Generator generates input vectors that are used to search for anomalies that exist between the intent (specifications) and the implementation (HDL Code). Modern generators create directed-random and random stimuli that are statistically driven to verify random parts of the design. The randomness is important to achieve a high distribution over the huge space of the available input stimuli. To this end, users of these generators intentionally under-specify the requirements for the generated tests. It is the role of the generator to randomly fill this gap. This allows the generator to create inputs that reveal bugs not being searched by the user. Generators also bias the stimuli towards design corner cases to further stress the logic. Biasing and randomness serve different goals and there are trade-offs between them. As a result, different generators have a different mix of these characteristics. Since the input for the design must be valid (legal) and many targets (such as biasing) should be maintained, many generators use the constraint satisfaction problem (CSP) technique to solve the complex verification requirements. The legality of the design inputs and the biasing arsenal are modelled. The model-based generators use this model to produce the correct stimuli for the target design.

Drivers translate the stimuli produced by the generator into the actual inputs for the design under verification. Generators create inputs at a high level of abstraction, as transactions and drivers convert this input into actual design inputs as defined in the specification of the design's interface.

A Monitor converts the state of the design and its outputs to a transaction abstraction level so it can be stored in a scoreboard's database to be checked later on.

The Scoreboard/Checker validates that the contents of the scoreboard are legal. There are cases where the generator creates expected results, in addition to the inputs. In these cases, the checker must validate that the actual results match the expected ones.

An Arbitration Manager is configured to manage all the above components together.

The simulator produces the outputs of the design, based on the design's current state (the state of the flip-flops) and the injected inputs. The simulator has a description of the design net-list. This description is created by synthesizing the HDL to a low gate level net-list.

Simulation based verification is widely used to "simulate" the design, since this method scales up very easily. Stimulus is targeted to exercise each line in the HDL code. A testbench is built to functionally verify the design by providing meaningful scenarios to check that given certain input, the design performs to the specification.

The level of effort required to debug and then verify the design is proportional to the maturity of the design. That is, early in the design's life, bugs and incorrect behaviour are usually found quickly. As the design matures, the simulation requires more time and resources to run, and errors will take progressively longer to be found.

One of the most critical tasks in developing a new hardware such as Integrated Circuit (IC) chips, Field-Programmable Gate Arrays (FPGA), Application-Specific Integrated Circuits (ASIC), System On Chips (SOC) etc. is to verify them for different design/function/performance specifications. These specifications may be predefined by the customer of the chips or can be an industry standard too. Another challenge faced by the verification team of this hardware is to debug the failures (if any) that arises during the process of verification using the log file(s) and identify the root cause of the failure.

An input packets entering a Design Under Verification/System Under Verification (DUV/SUV) verifies the DUV/SUV by performing a simulation. However, the simulation may run for a long time before its completion. In this case, an error may occur at certain point during the simulation. In case of occurrence of the errors, a user may have to re-run the entire simulation from the initial point, after fixing the errors. Also, the user might want to make changes in the simulation at the certain point or to control the simulation. In this case, the user may have to wait for the completion of the simulation. Once the simulation completes, the user may make changes in the simulation again and then re-run the simulation. Thus, the user might have to spend lot of time till the completion of the simulation. Currently, there is no standard way to control this kind of simulation debug cycle and reduce the human effort spent.

SUMMARY

This summary is provided to introduce aspects related to systems and methods for interactively controlling the course of a functional simulation and the aspects are further described below in the detailed description. This summary is not intended to identify essential features of the claimed subject matter nor is it intended for use in determining or limiting the scope of the claimed subject matter.

In one embodiment, a system for interactively controlling the course of a functional simulation based on user inputs is illustrated. The system may comprise a Design Under Verification or System Under Verification (DUV/SUV) and a testbench configured to communicate with the DUV/SUV. The DUV/SUV may be configured to process a set of input data/packets generated by a "stimulus generation unit" of the testbench. The set of input data/packets indicates a stimulus. The set of input data/packets may be configured to simulate and verify the DUV/SUV based on a target test case, from a set of test cases. The testbench further comprises an "event identification unit", an "event notification unit" and a "stimulus modifier unit". The "event identification unit" may be configured to identify occurrence of an event, at runtime, during simulation associated with the target test case. The "event identification unit" may be further configured to pause the simulation upon identification of the event. The "event notification unit" of the testbench may be configured to transmit a message to a user. The message may indicate the occurrence of the event at runtime during the simulation. The "event notification unit" may be further configured to receive one or more user inputs. The one or more inputs indicate response to the message. The "stimulus modifier unit" of the testbench may be configured to update the "stimulus generation unit" to generate the new stimulus based on the one or more user inputs received at the "event notification unit". The "stimulus modifier unit" may be further configured to resume the paused simulation, thereby interactively controlling the course of a functional simulation of DUV/SUV.

In another embodiment, a method for interactively controlling the course of a functional simulation based on user inputs is illustrated. The method may comprise generating, by a "stimulus generation unit", a set of input data/packets as a stimulus to verify a Design Under Verification or System Under Verification (DUV/SUV) based on a target test case, from a set of test cases. The method may further comprise identifying, by an "event identification unit", an event at runtime during simulation associated with the target test case. The simulation, associated with the target test case, may be paused upon identification of the event. Further, the method may comprise transmitting, by an "event notification unit", a message to a user. The message may indicate occurrence of the event. Furthermore, the method may comprise receiving, by the "event notification unit", one or more user inputs in response to the message. The method may further comprise updating the "stimulus generation unit", by a "stimulus modifier unit", to generate a new stimulus based on the one or more user inputs. Further, the method may comprise resuming, by the "stimulus modifier unit", the paused simulation, with the new stimulus based on the one or more user inputs, thereby interactively controlling the course of a functional simulation of DUV/SUV.

In yet another implementation, a computer program product having embodied computer program for interactively controlling the course of a functional simulation based on user inputs is disclosed. In one embodiment, the program may comprise a program code for generating a set of input data/packets as a stimulus to verify a Design Under Verification or System Under Verification (DUV/SUV) based on a target test case from a set of test cases. Further, the program may comprise a program code for identifying occurrence of an event, at runtime, during simulation associated with the target test case. The simulation, associated with the target test case, may be paused upon identification of the event. Furthermore, the program may comprise a program code for transmitting a message to a user. The message may indicate occurrence of the event. The program may further comprise a program code for receiving one or more user inputs in response to the message. Further, the program may comprise a program code for generating a new stimulus based on the one or more user inputs. Furthermore, the program may comprise a program code for resuming the paused simulation, with the new stimulus based on the one or more user inputs, thereby interactively controlling the course of a functional simulation of DUV/SUV.

BRIEF DESCRIPTION OF DRAWINGS

The detailed description is described with reference to the accompanying figures. In the figures, the left-most digit(s) of a reference number identifies the figure in which the reference number first appears. The same numbers are used throughout the drawings to refer like features and components.

DETAILED DESCRIPTION

The present system facilitates/provides the means for interactively controlling the course of a functional simulation of Design Under Verification/System Under Verification (DUV/SUV). The course of the functional simulation of DUV/SUV may be controlled based on the user inputs. The DUV/SUV may correspond to a design of an electronic circuit or a design of an integrated chip written in a Hardware Description Language (HDL). The system comprises a DUV/SUV and a testbench configured to communicate with the DUV/SUV.

In one embodiment, the testbench may enable a "stimulus generation unit" to generate a set of input data/packets. The set of input data/packets may correspond to a stimulus. The set of input data/packets may be configured to verify and simulate the DUV/SUV based on a target test case, from a set of test cases. In one aspect, the DUV/SUV may be configured to process the set of input data/packets received from the testbench. Further, the testbench may enable an "event identification unit" to identify an event at runtime during the simulation, associated with a target test case. The event may be associated with a user defined condition at runtime of the simulation. Further, the event may be a predefined error, a pre-defined number of errors, a pre-defined number of stimulus generated, a normal completion of transactions and the like. Upon identifying the event, the "event identification unit" may pause the simulation.

Once the simulation is paused, the testbench may enable an "event notification unit". The "event notification unit" may be configured to transmit a message to a user. In one embodiment, the message may indicate occurrence of the event at runtime during the simulation. In another embodiment, the message may correspond to a request for one or more user inputs at runtime during the simulation. Further, the "event notification unit" may be configured to wait for a pre-defined time interval to receive the one or more user inputs. The one or more inputs are received using either a "system" system function call or a "C-DPI (Direct Programming Interface)" function call in a System Verilog code. In one embodiment, in case if no user input is received before the pre-defined time interval, the "event notification unit" may be further configured to end the simulation.

Upon receiving the one or more user inputs, the testbench may enable the "stimulus modifier unit" to update the "stimulus generation unit" to generate a new stimulus based on the one or more inputs. Once the new stimulus is generated, the "stimulus modifier unit" may be further configured to resume the paused simulation. In other words, the "stimulus modifier unit" may be configured to update the "stimulus generation unit" to generate a new simulation sequence on-the-fly and pass the new simulation sequence to the paused simulation to resume it. In one aspect, the new sequence may correspond to the new stimulus.

Figure 1:
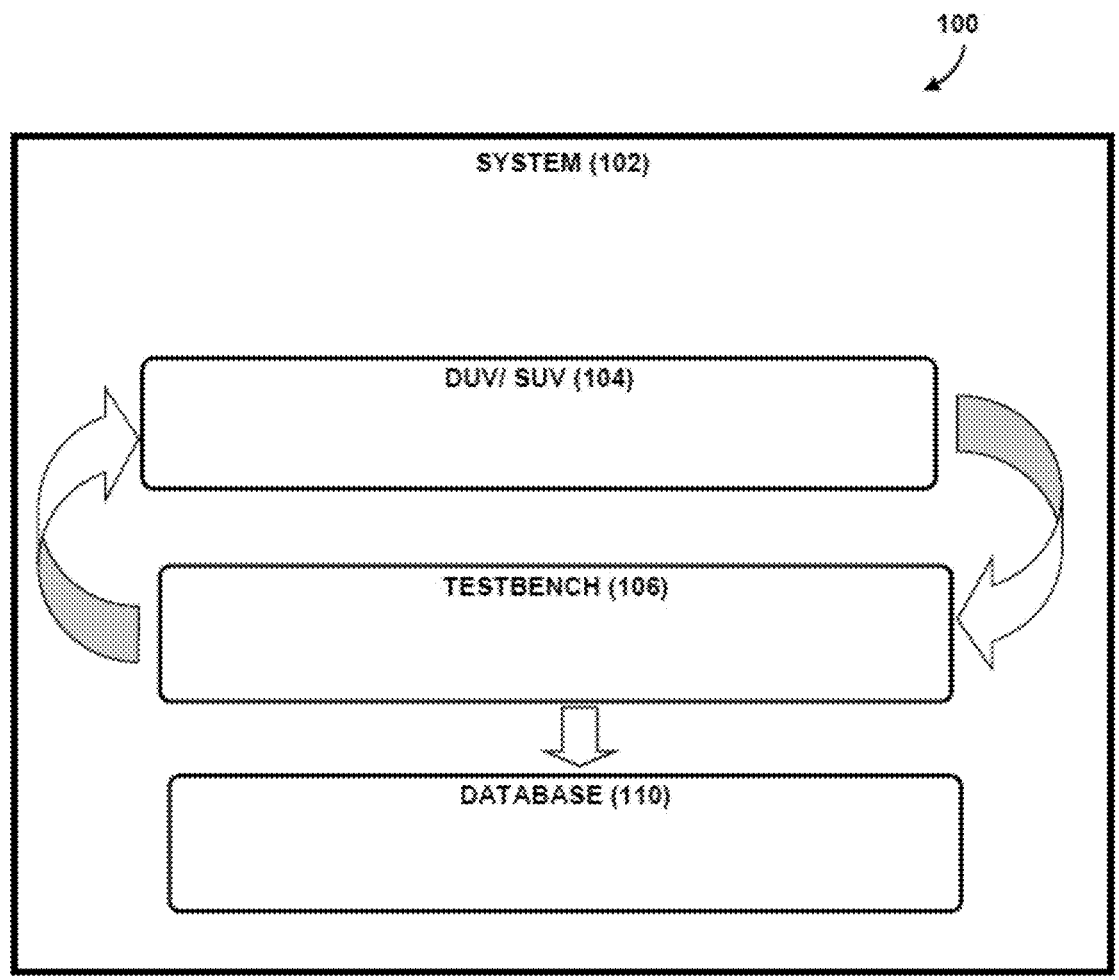
FIG. 1 illustrates an overview of a system configured to control the course of a functional simulation of Design Under Verification or a System Under Verification (DUV/SUV), in accordance with an embodiment of the present subject matter.

Referring now to FIG. 1, an overview of a system 102 configured to control the course of a functional simulation of Design Under Verification or System Under Verification (DUV/SUV) 104 is illustrated. The system 102 includes a testbench 106 configured to communicate with a DUV/SUV 104. Further, the testbench 106 may be connected to a database 110. In one embodiment, the DUV/SUV may process a set of input data/packets. The processing of the set of input data/packets may correspond to simulation of a target test case, from a set of test cases.

In one embodiment, the testbench 106 is configured to generate and transmit a number of input data/packets to the DUV/SUV 104 in order to verify the DUV/SUV 104 based on the target test case, from the set of test cases.

In one embodiment, the testbench 106 may be configured to identify an event. Once the event is identified, the testbench 106 may be configured to pause the simulation, associated with the target test case. Further, the testbench 106 may transmit a message to a user. The message may indicate the occurrence of the event. Furthermore, the testbench 106 may receive one or more user inputs in response to the message. In one embodiment, the testbench 106 may wait for a pre-defined time interval to receive the one or more user inputs.

Once the one or more user inputs are received, the testbench 106 may generate a new stimulus based on the one or more user inputs. The new stimulus may correspond to new course of the simulation. The testbench 106 may resume the paused simulation, associated with the target test case, with the new stimulus based on the one or more user inputs. In one aspect, the course of the simulation may change due to the one or more user inputs. In one embodiment, if the one or more user inputs are not received before the pre-defined time interval, the testbench 106 may terminate the paused simulation.

In one embodiment, the testbench 106 may generate log data based on the simulation of the target test case. Further, the testbench 106 may store the log data in the database 110. The process of controlling the course of the functional simulation of Device Under Verification or System Under Verification (DUV/SUV) 104 is further elaborated with respect to FIG. 2.

Figure 2:
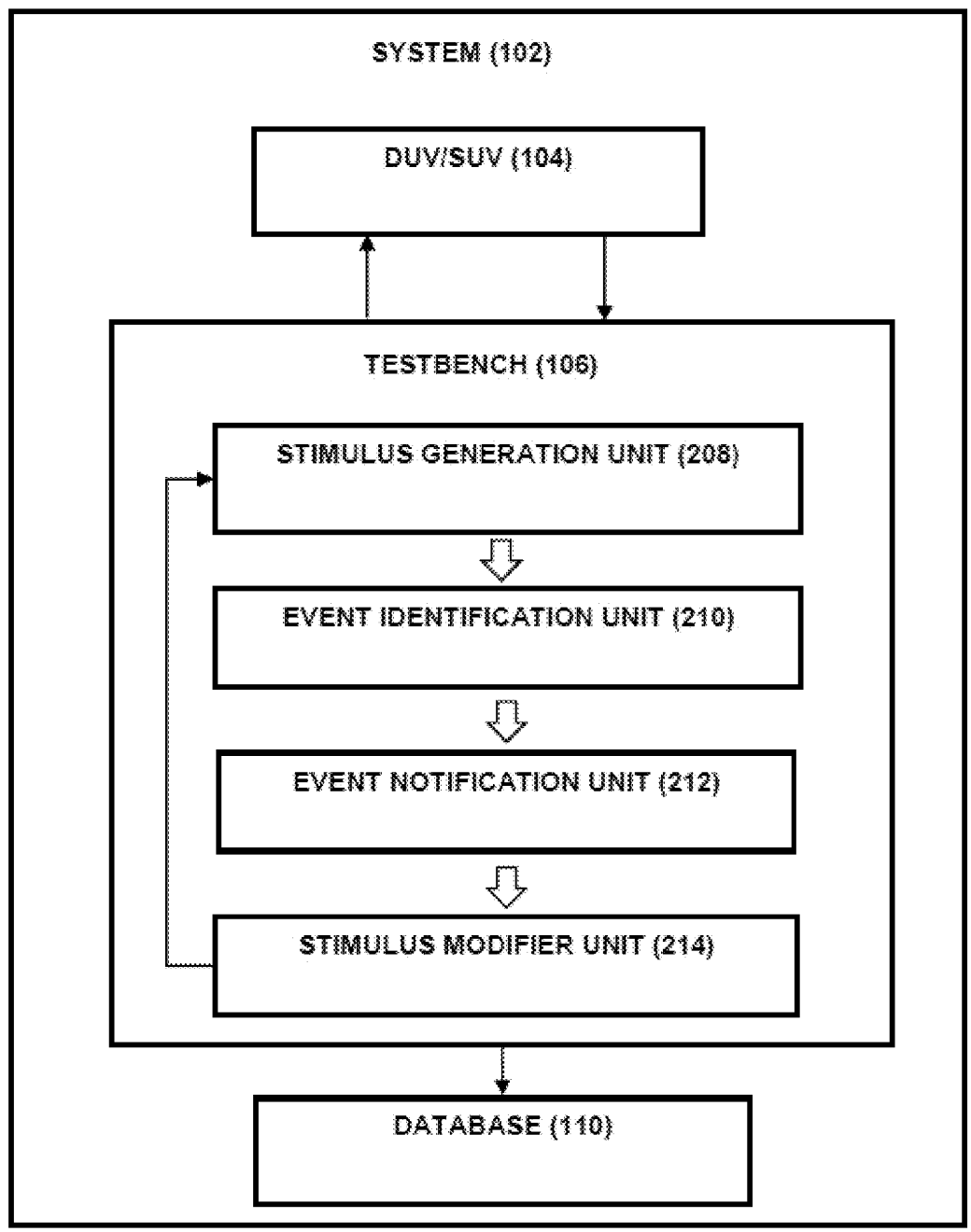
FIG. 2 illustrates components of the system for interactively controlling the course of a functional simulation of DUV/SUV, in accordance with an embodiment of the present subject matter.

Referring now to FIG. 2, the system 102 is illustrated in accordance with an embodiment of the present subject matter. In one embodiment, the system 102 comprises the DUV/SUV 104 connected to the testbench 106. Further, the testbench 106 may be connected to the database 110. The testbench 106 may include a "stimulus generation unit" 208, an "event identification unit" 210, an "event notification unit" 212, a "stimulus modifier unit" 214.

In one embodiment, based on the configuration inputs provided by a user, the "stimulus generation unit" 208 may be configured to generate a set of input data/packets. The set of input data/packets may correspond to a stimulus. Once the set of input data/packets is generated, the testbench 106 may be configured to transmit the set of input data/packets to the DUV/SUV 104. In one implementation, the "stimulus generation unit" 208 of the testbench 106 may transmit the set of input data/packets to the DUV/SUV 104. The DUV/SUV 104 may be configured to process the set of input data/packets. The processing of the set of input data/packets may correspond to simulation, associated with a target test case, from a set of test cases.

Further, the "event identification unit" 210 may be configured to identify an event at runtime during the simulation. The event may be any user defined condition like a pre-defined error, a predefined number of errors, a predefined number of stimulus generated, a normal completion of transactions and the like. Once the event is identified, the "event identification unit" 210 may pause the simulation associated with the target test case.

Once the simulation is paused, the "event notification unit" 212 may be configured to transmit a message to a user. The message may be an email message. The message may indicate the occurrence of the event at runtime during the simulation. In one aspect, the message may be configured to inform the user regarding the occurrence of the event. In another aspect, the message may correspond to a request for receiving one or more inputs from the user.

Once the message is transmitted, the "event notification unit" 212 may be configured to wait, for a pre-defined time interval, to receive the one or more user inputs from the user. In one aspect, the "event notification unit" 212 may receive the one or more user inputs before the pre-defined time interval. The one or more user inputs may be received as a response to the message. In one embodiment, the "event notification unit" 212 may receive the one or more user inputs using either a "$system" system function or a "C-DPI (Direct programming Interface)" function. The one or more user inputs may correspond to read all error registers, write to a specific register, read from a specific register, read status registers, read counters and the like. In another aspect, if no inputs are received from the user before the pre-defined time interval, the "event notification unit" 212 may be further configured to end the paused simulation associated with the target test case.

In one embodiment, the "event notification unit" 212 may use the "system" system function to receive the one or more user inputs. The "$system" system function may invoke a Linux command "read". In one example, the "event notification unit" 212 may receive the user input using a format "rd_reg <address>" to read a register. Similarly, the "event notification unit" 212 may use the format "wr_reg <address> <data>" to receive user input to write to a register. Once the user input is received, the user input may be directed to a file which can be parsed to understand the user command/data and generate a structure that could be used for creating the instructed user stimulus. In one example, the "$system" system function may be implemented as below.

```
"$system" System Function based Implementation:
typedef struct {
string cmd;
int addr;
int data;
} USR_CMD_t;
USR_CMD_t usr_cmd;
initial
begin
    $display("Enter the Input for Reading/Writing the Registers \n
        For Reading registers, type : rd_reg <Address> \n
        For writing registers, Type : wr_reg <Address> <Data>");
    $system("read user_input;echo $user_input > user_input0");
    fd = $fopen("user_input0", "r");
    r = $fscanf(fd, "%s %d %d", usr_cmd.cmd, usr_cmd.addr,
    usr_cmd.data);
    $display("command = %s Addr = %d Data = %d",usr_cmd.cmd,
usr_cmd.addr, usr_cmd.data);
End
```

In one embodiment, the "event notification unit" 212 may use the "C-DPI (Direct Programming Interface)" function to receive the one or more user inputs. The DPI function may allow direct inter-language function calls between a System Verilog (SV) and any foreign programming language with a C function call protocol and linking model. The DPI function may enable re-use of in-built/library functions that are already existing in the foreign programming language. In one embodiment, a value that is passed through the DPI is specified in SV code as a value of SV data type, while the same value shall be specified in C code as a value of C type. Thus, a pair of matching type definitions may be required to pass a value through DPI: the SV definition and the C definition. "Import" declarations may provide a local task or function name with a foreign implementation. Further, calling a foreign task or function may be syntactically identical to calling a native SV task or function.

In one embodiment, the sequence of flow between the SV, SV-DPI, and C-program layers is illustrated further. In one aspect, once the "event notification unit" 212 transmits the message, associated with the occurrence of the event, to the user, the System Verilog (SV) code may call the DPI imported C-program task/function in order to receive the one or more user inputs. In one embodiment, at the C-program layer, once the event is identified, the "event identification unit" 210 may pause the simulation associated with the target test case, at a current state of the simulation. Further, the "event notification unit" 212 may transmit the message to the user and wait for the pre-defined time interval to receive the one or more user inputs.

In one embodiment, one or more commands may be displayed to the user to select as the one or more user inputs. In one aspect, if no user input is received from the user before the pre-defined time interval, the command such as "finish" may be sent by the "event notification unit" 212. In one example, the command "finish" corresponds to terminating the simulation. In another aspect, once the "event notification unit" 212 receives the one or more user inputs that are valid, the one or more user inputs may be sent to the SV layer for further processing. In yet another aspect, if the user enters any invalid command, the one or more command may be again displayed to the user with a notification. The notification may indicate that 'command is invalid please try again'. In this case, the SV layer may decide the course of the simulation based on the one or more user inputs. In one example, the C-layer function may be implemented as below.

```
C-layer sample Implementation:
#include "svdpi.h"
#include "stdio.h"
#include "poll.h"
#include "string.h"
//For internal use only - do not change/remove
#define USR_CMD_WAIT_SEC(x) x*1000//1000milli_seconds=
1second
#defineUSR_CMD_WAIT_MIN(x)x*USR_CMD_WAIT_SEC(60)//
60seconds=1minute
#defineUSR_CMD_WAIT_HRS(x)x*USR_CMD_WAIT_MIN(60)//
60minute=1hour
//Change this define to change the wait time for user command input
#define USR_CMD_WAIT_TIME USR_CMD_WAIT_SEC(60)//60s
typedef struct {
char* cmd;
int addr;
int data;
int offset;
int num_reads;
} USR_CMD_t;
char command[20];
void get_usr_cmd(USR_CMD_t *usr_cmd)
{
    struct pollfd cmdpoll = { 0, POLLIN|POLLPRI };
    START_GET_CMD:
    printf("C: Available Commands:\nrd reg      - Read a particular
register\nwr reg      - Write a particular register\nfinish    -
End now\nPlease enter a Command: \n");
    usr_cmd->cmd = "finish";//default command
    if(poll(&cmdpoll, 1, USR_CMD_WAIT_TIME ))
{
  //Scan the command
    scanf("%[^\n]%*c", command);
    usr_cmd->cmd = &command;
    printf("Entered Command = %s\n", usr_cmd->cmd);
    //command 1 - rd reg
    if(!strcmp(usr_cmd->cmd,"rd reg"))
    {
      printf("rd reg: Enter the reg. address(hex): ");
      scanf("%x%*c", &usr_cmd->addr);
    }
    //command 2 - wr reg
    else if(!strcmp(usr_cmd->cmd,"wr reg"))
    {
      printf("wr reg: Enter the reg. address(hex) <space> reg. data(hex): ");
      scanf("%x %x%*c", &usr_cmd->addr, &usr_cmd->data);
    }
    //command 3 - finish
    else if(!strcmp(usr_cmd->cmd,"finish"))
    {
      printf("finish: Exiting Now!! Thanks for using!!!\n ");
    }
    else
    {
        printf("Invalid Command - Please Enter any one of the available
commands!!!\n");
      goto START_GET_CMD;
    }
}
else
{
    printf("C: Time-out!! No command received for %0d   seconds!!!\n",
USR_CMD_WAIT_TIME/1000);
    printf("C: Sending the command finish\n");
    usr_cmd->cmd = "finish";
  }
}
```

Once the one or more user inputs are received, the "stimulus modifier unit" 214 may be configured to update the "stimulus generation unit" 208 based on the one or more user inputs. In one embodiment, the "stimulus modifier unit" 214 may generate a new stimulus by updating the "stimulus generation unit" 208. Upon generating the new stimulus, the "stimulus modifier unit" 214 may resume the paused simulation. In this case, the course of the simulation may change according to the new stimulus. In one example, the "stimulus modifier unit" 214 may wait to complete the simulation, using the new stimulus. The course of the simulation may change upon processing of the new stimulus.

In one embodiment, once the new stimulus is generated, the new stimulus may be used to verify the DUV/SUV. After the application of the new stimulus to the DUV/SUV, the simulation may be paused to wait for the one or more user inputs again. Once the one or more user inputs are received, the "stimulus modifier unit" 214 may again update the "stimulus generation unit" 208 to generate a new stimulus based on the one or more user inputs. Thus, the course of the simulation may further change based on the one or more user inputs at runtime during the simulation. In other words, a process of pausing the simulation, receiving the one or more user inputs, resuming the simulation by generating a new stimulus and applying it to the DUV/SUV, and modifying the course of simulation may be repeated based on inputs received from the user.

In one embodiment, one of the user input may be invalid or the user may want to change the stimulus at runtime during the simulation. In this case, if the user selects or transmits the corresponding user input, then the "stimulus modifier unit" 214 may update the "stimulus generation unit" 208 to generate the new stimulus, based on the new user input. Thus, the "stimulus modifier unit" 214 may resume the simulation with the new stimulus based on the one or more user inputs, associated with the new user input.

Further, the testbench 106 may generate log data during the simulation of the target test case. Once the log data is generated, the testbench 106 may store the log in the database 110. In one aspect, the user may further refer the log data to determine flow of the simulation.

Figure 3:
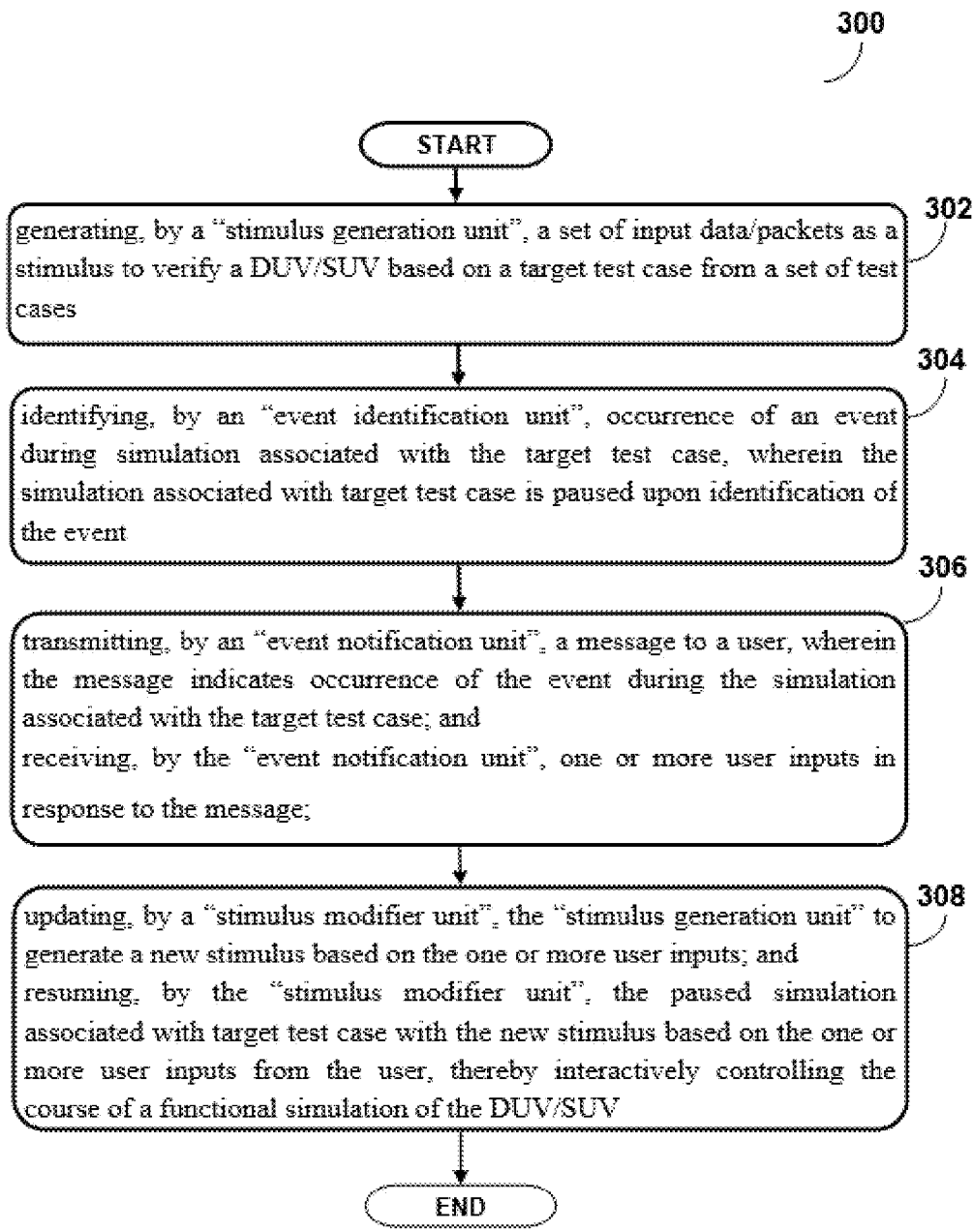
FIG. 3 illustrates a flow diagram to control the course of a functional simulation of DUV/SUV, in accordance with an embodiment of the present subject matter.

Referring now to FIG. 3, a method 300 for interactively controlling the course of a functional simulation of DUV/SUV 104 is disclosed, in accordance with an embodiment of the present subject matter. The order in which the method 300 is described is not intended to be construed as a limitation, and any number of the described method blocks can be combined in any order to implement the method 300 or alternate methods. Additionally, individual blocks may be deleted from the method 300 without departing from the spirit and scope of the subject matter described herein. Furthermore, the method 300 can be implemented in any suitable hardware, software, firmware, or combination thereof. However, for ease of explanation, in the embodiments described below, the method 300 may be considered to be implemented in the above described system 102.

At block 302, based on the configuration inputs provided by a user, a set of input data/packets may be generated. In one implementation, the "stimulus generation unit" 208 may be configured to generate the set of input data/packets as a stimulus. Once the set of input data/packets is generated, the testbench 106 may be configured to transmit the set of input data/packets to the DUV/SUV 104. In one implementation, the "stimulus generation unit" 208 of the testbench 106 may transmit the set of input data/packets to the DUV/SUV. The DUV/SUV 104 may be configured to process the set of input data/packets. Further, the set of input data/packets may simulate and verify the DUV/SUV 104, based on a target test case, from a set of test cases.

At block 304, an event may be identified at runtime during the simulation associated with the target test case. In one implementation, the "event identification unit" 210 may be configured to identify the event at runtime during the simulation, associated with the target test case. The event may be any user define conditions like predefined error, a predefined number of errors, a predefined number of stimulus generated, a normal completion of transactions and the like. Once the event is identified, "event identification unit" 210 may pause the simulation.

At block 306, a message may be transmitted to the user. In one implementation, the "event notification unit" 212 may be configured to transmit a message to the user. The message may indicate the occurrence of the event at runtime during the simulation. Once the message is transmitted, one or more user inputs may be received from the user as a response to the message. The one or more user inputs may be received before a pre-defined time interval. In one embodiment, in case if no user input is received from the user before the pre-defined time interval, then the simulation may be terminated. In one embodiment, the one or more user inputs may be received using either a "system" system function or a "C-DPI (Direct programming Interface)" function.

At block 308, a new stimulus may be generated based on updating the "stimulus generation unit" 208. In one implementation, the "stimulus modifier unit" 214 may be configured to update the "stimulus generation unit" 208 to generate new stimulus based on the one or more user inputs. Upon generating the new stimulus, the paused simulation may be resumed. In one embodiment, the new stimulus may be used by the simulation. In this case, the course of the functional simulation may change according to the new stimulus.

In one embodiment, once the new stimulus is generated, the new stimulus may be used to verify the DUV/SUV. After the application of the new stimulus to the DUV/SUV, the simulation may be paused again. Further, the one or more user inputs may be received from the user. Once the one or more user inputs are received, the "stimulus generation unit" 208 may be again updated to generate a new stimulus based on the one or more user inputs. Thus, the course of the simulation may further change based on the one or more user inputs at runtime during the simulation. In other words, a process of pausing the simulation, receiving the one or more user inputs, resuming the simulation by generating a new stimulus and applying it to the DUV/SUV, and modifying the course of simulation may be repeated based on inputs received from the user.

We claim:

1. A system for interactively controlling the course of a functional simulation based on user inputs, the system comprising:
   a Design Under Verification or System Under Verification DUV/SUV, wherein the DUV/SUV is configured to process a set of input data/packets;
   a testbench configured to:
      communicate with the DUV/SUV;
      generate the set of input data/packets as a stimulus to simulate and verify the DUV/SUV based on a target test case from a set of test cases;
      identify occurrence of an event at runtime during simulation associated with the target test case, wherein the testbench is further configured to pause the simulation associated with the target test case upon identification of the event;
      transmit an email message to a user, wherein the email message indicates the occurrence of the event during simulation associated with the target test case, and wherein the email message is in form of one or more commands displayed to the user to select as the one or more user inputs;
      receive one or more user inputs in response to the email message using a "$system" system function that invokes a linux command, wherein the linux command corresponds to one or more of read all error registers, write to a specific register, read from a specific register, read status registers, and read counters;
      direct the linux command corresponding to the one or more user inputs to a file, wherein the file is parsed to interpret the linux command and generate a structure, and wherein the structure is used to create a stimulus instructed by the user; and
      resume the simulation and change the course of the simulation of the DUV/SUV based on the stimulus instructed by the user to read error registers, read status registers, or read counters based on the one or more user inputs received, thereby interactively controlling a course of functional simulation of the DUV/SUV.

2. The system of claim 1, wherein the event is associated with a user defined condition at simulation runtime, and wherein the event corresponds to a predefined error, a predefined number of errors, a predefined number of stimulus generated or a normal completion of transactions.

3. The system of claim 1, further configured to wait for a pre-defined time interval after the event notification in order to receive the one or more user inputs in response to the email message.

4. The system of claim 3, further configured to terminate the simulation associated with the target test case, when one or more user inputs are not received before the pre-defined time interval.

5. A method for interactively controlling the course of a functional simulation of DUV/SUV based on user inputs, the method comprising steps of:
   generating, a set of input data/packets as a stimulus to verify a DUV/SUV based on a target test case from a set of test cases;
   identifying, occurrence of an event during simulation associated with the target test case, wherein the simulation associated with target test case is paused upon identification of the event;
   transmitting, an email message to a user, wherein the email message indicates occurrence of the event during the simulation associated with the target test case, and wherein the email message is in form of one or more commands displayed to the user to select as the one or more user inputs;
   receiving, one or more user inputs in response to the email message using a "$system" system function that invokes a linux command, wherein the linux command corresponds to one or more of read all error registers, write to a specific register, read from a specific register, read status registers, and read counters;
   directing the linux command corresponding to the one or more user inputs to a file, wherein the file is parsed to interpret the linux command and generate a structure, and wherein the structure is used to create a stimulus instructed by the user; and
   resuming, the paused simulation and change the course of the simulation of the DUV/SUV based on the stimulus instructed by the user to read error registers, read status registers, or read counters based on the one or more user inputs received thereby interactively controlling the course of a functional simulation of DUV/SUV.

6. The method of claim 5, wherein the event is associated with a user defined condition at simulation runtime, and wherein the event corresponds to a predefined error, a predefined number of errors, a predefined number of stimulus generated or a normal completion of transactions.

7. The method of claim 5, further comprises waiting for a pre-defined time interval after the event notification in order to receive the one or more user inputs in response to the email message, wherein the one or more user inputs correspond to one or more of read all error registers, write to a specific register, read from a specific register, read status registers, and read counters.

8. The method of claim 7, further comprises terminating the simulation associated with target test case, when the one or more user inputs are not received before the pre-defined time interval.

* * * * *